June 1, 1971 T. J. LA CHAPELLE 3,582,410

PROCESS FOR PRODUCING METAL BASE SEMICONDUCTOR DEVICES

Filed July 11, 1969

INVENTOR.
THEODORE J. LACHAPELLE
BY Robert G. Rogers
ATTORNEY

United States Patent Office 3,582,410
Patented June 1, 1971

3,582,410
PROCESS FOR PRODUCING METAL BASE SEMICONDUCTOR DEVICES

Theodore J. La Chapelle, Orange, Calif., assignor to North American Rockwell Corporation, El Segundo, Calif.

Filed July 11, 1969, Ser. No. 841,074
Int. Cl. H01l 7/34
U.S. Cl. 148—186 10 Claims

ABSTRACT OF THE DISCLOSURE

Two single crystal semiconductor layers or one single crystal semiconductor layer and a single crystal insulating substrate are produced in juxtaposition with each other. A control layer, for example conductive or resistive, is diffused along the interface between the two layers to control the transfer of energy between the layers.

BACKGROUND OF THE INVENTION

(1) Field of the invention

The invention relates to a process for producing either a highly conductive layer or a highly resistive layer between two existing layers of a single crystal material.

(2) Description of the prior art

In the existing art, conducting layers are normally produced between similar single crystal layers by producing first a layer of single crystal material, introducing diffusions into one face of a semiconductor layer and then producing a subsequent semiconductor layer on top of the diffused region. The semiconductor materials, for example silicon, are dissimilar in that the first layer is resistive, the diffused layer is substantially conductive and the final layer is highly resistive. The inner layer produced by diffusing the first layer is called a buried-layer epitaxial collector contact. The process is used to produce semiconductor devices having a low resistive and high current collector contact. However, it has been difficult to grow high quality semiconductor materials on highly doped regions.

In addition, it is virtually impossible to produce a highly conductive region between a semiconductor layer grown on top of an insulating substrate.

A process is preferred in which the two single crystal semiconductor layers, or one semiconductor layer and an insulating substrate layer, could be produced prior to forming the control region between the two layers. Such a process would enable the production of semiconductor devices having high isolation (where the control region is resistive) between the semiconductor layers. In addition, to enable the production of single crystal semiconductor layers, the preferred process should also provide a low resistive and high current layer between the single crystals layers (semiconductor on insulator or semiconductor on semiconductor). The present invention provides such a preferred process.

SUMMARY OF THE INVENTION

Briefly, a first single crystal semiconductor layer is used as a substrate for the deposition of a second single crystal semiconductor layer. After the semiconductor layers have been produced, a conductive or resistive material is diffused along the interface between the two semiconductor layers.

In other embodiments, a first single crystal semiconductor layer comprising an insulating material is used as a substrate for the deposition of a second single crystal semiconductor layer. After the layers have been produced, a conducting layer is formed by diffusing a material such as a metal along the interface between the two layers. The resulting region provides a control layer between the two layers and may be used in producing semiconductor devices.

More specifically, it is known that there is an extreme difference in the diffusion rate of certain interstitially diffusing atoms moving through highly imperfect structure or of substitutionally arranged atoms (as normally dispersed in a lattice) moving along a grain boundary or an imperfection line as compared with the same atoms moving through well-structured materials. The difference in diffusion rates permits a metal film to be deposited along the interface between the semiconductor layers and not to diffuse into the bulk of the semiconductor materials.

In other embodiments, the process can still be used to add a third layer, which has a high or a low conductivity depending on whether the material is metallic or whether the atoms of the material used compensate one or the other of the semiconductor layers, between the heterojunction of the layers.

Therefore, it is an object of this invention to provide an improved process for producing a semiconductor device.

Another object of this invention is to provide a process for producing a conductive or resistive film between two single crystal layers of material by interstitial diffusion.

A still further object of the invention is to provide a process for producing a relatively thin metal film between two semiconductor layers by diffusing the metal along the interface between the semiconductor layers.

Still another object of the invention is to provide a process for producing metal base transistors, which eliminates the need for producing a metal layer on a semiconductor substrate prior to forming a second semiconductor layer on the other face of the metal layer.

A still further object of the invention is to form, by diffusion, a third layer of material, either metallic or non-metallic, between two single crystal semiconductor layers.

A still further object of the invention is to produce a third layer along a heterojunction between semiconductor layers by diffusion techniques.

A still further object of the invention is to produce either a highly conductive layer or an electrically insulating layer between a heteroepitaxially deposited film of a semiconductor layer previously structured onto a single crystal non-semiconductor substrate.

These and other objects of the invention will become more apparent when taken in connection with the description of the drawings, a brief description of which follows:

DESCRIPTION OF THE PREFERRED EMBODIMENT

Figures 1A, 1B, 1C:
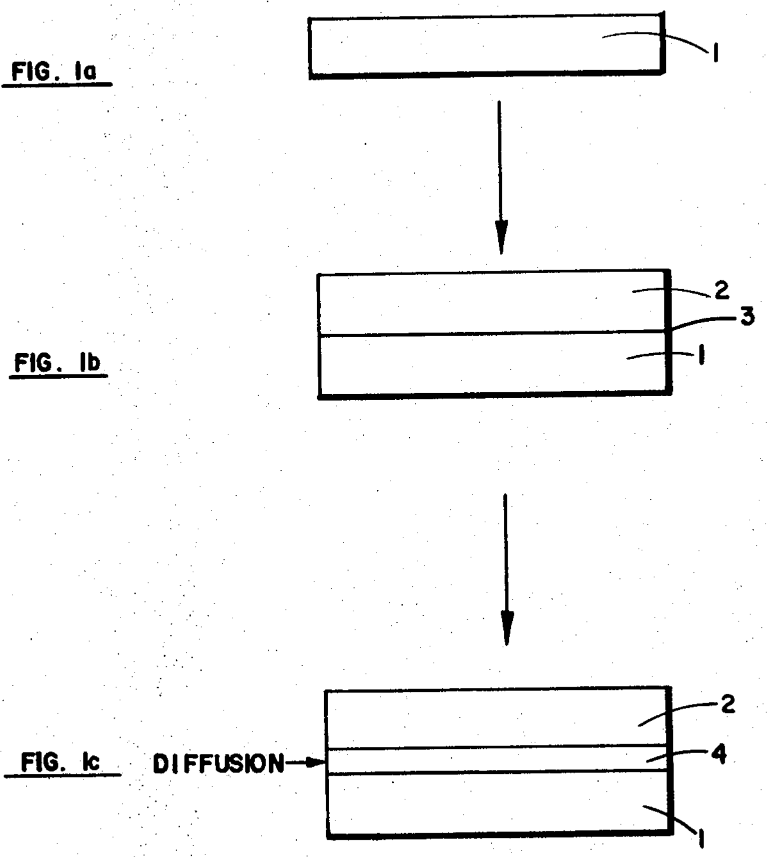
FIG. 1*a* illustrates a first semiconductor layer.
FIG. 1*b* illustrates the formation of a second semiconductor layer on one face of the first semiconductor layer.
FIG. 1*c* illustrates the formation of a diffused metal base between the two layers.

FIG. 1*a* illustrates layer 1, which may be a monocrystalline material such as silicon, gallium arsenide, gallium phosphide, or similar semiconductive material. Although, in the preferred embodiment the layer 1 is comprised of a single crystalline material, for other embodiments a polycrystalline material can be used. The semiconductor layer may be formed by vapor deposition techniques or by other processes well known to persons skilled in the art.

In another embodiment, however, the layer 1 may be a single crystal such as sapphire, silica, sodium chloride or similar materials. It is well known that certain semiconductor devices are produced, for example, in silicon films structured on to a sapphire insulating substrate.

FIG. 1*b* illustrates single crystal semiconductor layer 2 formed on one face of semiconductor layer 1 so that the layers are in juxtaposition with each other. The particular material selected for layer 2 depends on the type of material selected for layer 1. For example, if layer 1 is single crystal silicon, single crystal gallium arsenide could be selected as layer 2 and vice versa. Gallium arsenide could be selected as the second semiconductor layer if the first semiconductor layer is gallium phosphide. The particular material selected for each layer depends on the type of semiconductor device being fabricated. For example, if a diode device is being fabricated, one layer should be an N-type material and the other layer a P-type material.

A vapor deposition process or other processes, as indicated above, may be used to epitaxially produce layer 2 on top of layer 1. The configuration of the semiconductor layers, including length, width, thickness, etc., may vary according to the intended use for the completed structure. Layer 2 may be oriented in sheet form rather than single crystal.

An interface region, denoted generally by the numeral 3, is formed between semiconductor layers 1 and 2 as a natural consequence of the process of depositing a layer of one type of material on the face of a different type of material. When two dissimilar materials are deposited in face-to-face contact, the lattice structures of the two layers do not match so that the region is imperfect. Hence, a barrier, or interface, is formed between the semiconductor layers.

The interface region forms an electrical barrier to the flow of electrons between the layers except for high energy electrons. As a result, devices fabricated from such a structure are high frequency limited. Since an operable semiconductor device having a useful frequency range requires electrons to flow relatively easily from one layer to the other, some means must be provided to either eliminate or control the barrier. By controlling the resistance of the barrier layer, the frequency response of a semiconductor device could also be controlled. The frequency response is inversely proportional to an increase in resistance of the barrier region.

FIG. 1*c* illustrates film 4 produced along the interface region 3 between layers 1 and 2 for the purpose of controlling the barrier resistance. The film, having a preferred thickness of between 50 and 200 angstroms, may be comprised of gold, silver, copper, platinum or common semiconductor dopants such as boron, arsenic, gallium, phosphorus, etc.

The film may be comprised of a highly conductive or highly resistive material depending on a particular application. If the layer is highly conductive and the previous two layers comprise a semiconductor on an insulating substrate, it may be used as an electrical contact to the semiconductor layer. As a result, a relatively low resistive, high current collector contact would be produced for a transistor. In addition, if another conductive layer is deposited on the other face of the semiconductor layer, the two layers may be used in certain capacity or field effect applications. Where the initial layers comprise semiconductor materials, the diffused film may be either conductive or resistive depending on the type of semiconductor devices being produced. If the layer is resistive, relatively improved isolation can be achieved between the semiconductor layers. If the layer is conductive, transistors have a buried-layer collector contact.

In one diffusion process for forming the film, the entire semiconductor structure comprising layers 1 and 2 is thermally oxidized to form an epitaxially disposed oxide layer. The oxide layer is etched from the structure along the edges of semiconductor layers 1 and 2 to expose the interface region 3 between the layers. Photoetching techniques may be used to preferentially etch away the oxide coating.

After the interface is exposed, a material such as gold is deposited onto the interface region. Electro-deposition or electroless deposition techniques may be used to deposit the metal. The resulting structure is inserted inside a tube furnace filled with an inert gas, such as helium, and heated to a temperature of approximately 1000° C. The temperature may vary depending on the metal being diffused and depending on the semiconductor material involved. After a period of time necessary for the metal ions to diffuse along the interface structure, the combination of layers 1 and 2 with metal film 4 is removed from the furnace. As indicated above, since the metal diffuses along the imperfect structure of the interface layer at a relatively rapid rate, the ions are not diffused into the semiconductor layers so as to change the properties of the semiconductor materials.

Since the process for depositing one layer on the other layer can be controlled, the interface region is usually less than 200 angstroms. As a result, the metal film has a thickness of less than 200 angstroms. If the thickness of the film increases, the resistance increases so that the frequency response of a device produced from the structure is reduced.

The FIG. 1*c* structure can be processed according to known techniques to complete the fabrication of semiconductor devices such as transistors, diodes, etc. Since the farbrication of such devices is not within the scope of this invention, details of the process are not included. However, it should be understood that fabricated semiconductor devices include electrical connection to the metal base for controlling the flow of electrons between the layers.

I claim:

1. A process for producing semiconductor devices comprising the steps of, producing a first layer of a single crystal material in juxaposition with a second layer of a single crystal semiconductor material, diffusing a layer of a third material along the function of said first and second layers to form a third layer between said first and second layers.

2. The process recited in claim 1 wherein said first layer is an insulator.

3. The process recited in claim 1 wherein said first and second layers are comprised of different materials, and said third layer comprises a material for influencing the electrical impedance between said layers.

4. The process recited in claim 1 wherein said third layer comprises a highly conductive material.

5. The process recited in claim 1 wherein said third layer comprises a highly resistive material.

6. The process recited in claim 1 wherein said first and second layers comprise different semiconductor materials, said process further including the steps of preferentially depositing said material adjacent to the interface region of said first and second layers, and subjecting the combination of said layers and said deposited material to an environment for diffusing said material along the interface region between said layers at a relatively rapid rate for forming said third layer without interfering with the properties of said first and second layers.

7. The process recited in claim 6 wherein said material comprises a metal.

8. The process recited in claim 6 wherein said material comprises dopant atoms for producing a conducting layer.

9. The process recited in claim 6 wherein said first and second layers comprise silicon on sapphire and said third layer comprises a conductive material.

10. The process recited in claim 1 wherein said first and second layers comprise different single crystal semiconductor materials and said third layer comprises a resistive material.

References Cited

UNITED STATES PATENTS

| | | | |
|---|---|---|---|
| 3,433,684 | 3/1969 | Zanowick et al. | 148—33 |
| 3,484,657 | 12/1969 | Madoian et al. | 148—33.4 |

L. DEWAYNE RUTLEDGE, Primary Examiner

R. A. LESTER, Assistant Examiner

U.S. Cl. X.R.

117—106, 201; 148—1.5, 174, 175, 187